United States Patent [19]

Moss et al.

[11] 4,346,257
[45] Aug. 24, 1982

[54] LAMINATED BUS BAR WITH DIELECTRIC CERAMIC INSERTS

[75] Inventors: Lee C. Moss; Phillip J. Knox; Raymond W. Snyder, all of Rochester, N.Y.

[73] Assignee: Eldre Components, Inc., Rochester, N.Y.

[21] Appl. No.: 131,523

[22] Filed: Mar. 18, 1980

[51] Int. Cl.³ ............................................... H01B 5/00
[52] U.S. Cl. .................................. 174/72 B; 361/306
[58] Field of Search ................. 174/72 B, 68 B, 70 B, 174/71 B, 99 B, 129 B, 133 B; 361/306, 328, 329, 330; 333/238

[56] References Cited

U.S. PATENT DOCUMENTS

| | | | |
|---|---|---|---|
| 3,778,735 | 12/1973 | Steenmetser | 333/238 |
| 3,886,654 | 6/1975 | Erdle | 174/72 B X |
| 4,236,038 | 11/1980 | Taylor | 174/72 B |
| 4,236,046 | 11/1980 | De Vries | 174/72 B |
| 4,266,091 | 5/1981 | Fukuda | 174/72 B |

*Primary Examiner*—B. A. Reynolds
*Assistant Examiner*—D. A. Tone
*Attorney, Agent, or Firm*—Shlesinger, Fitzsimmons & Shlesinger

[57] ABSTRACT

The capacitance of the laminated bar is substantially increased by separating each pair of conductors by a thin, flexible layer of dielectric insulation which has incorporated in an opening therein a thin, wafer-like dielectric ceramic insert, which may comprise a barium titanate composition forming a thin substrate opposite sides of which are metalized, or coated with a thin layer of metal. The strip of insulation is partially cured after the placement of the insert into its openings, thereby to cause part of the resin coating on the insulation to flow into engagement with, and to fix the insert in, the opening in the insulation. This permits the partially cured insulation to be manipulated during its incorporation into a bus bar assembly where it is interposed between two strip conductors. The assembly is thereafter laminated in a dielectric jacket in such manner that opposite sides of each dielectric ceramic insert will be engaged with the confronting surfaces of adjacent conductors. Any number of inserts may be employed in each layer of insulation which separates adjacent conductors; and alternate conductors, by way of example, can be connected to each other through the agency of their projecting terminals or tabs in order selectively to increase the capacitance between various conductors in a bar.

7 Claims, 5 Drawing Figures

LAMINATED BUS BAR WITH DIELECTRIC CERAMIC INSERTS

This invention relates to laminated bus bars, and more particularly to a laminated bar of the type in which thin dielectric ceramic wafers or inserts are incorporated in its insulation to increase its electrical capacitance.

Laminated bus bars of the type described are frequently employed for transmitting power to a variety of circuits, including circuits which utilize AC or DC signals, or combinations of both. Preferably these bus bars have low characteristic impedance and high capacitance. U.S. Pat. No. 1,999,137, for example, discloses a multi-layer conductor or bus bar utilized in radio apparatus, and because of its high capacitance is referred to as a distributor-condenser strip. This patent suggest various ways of interconnecting the several conductive layers or strips of the bar in order to increase the capacitance as between selected layers.

High capacitance bus bars are even more important in transmission of signals in modern day computers, wherein relatively low voltage DC signals must be fed to various components in printed circuit boards, and the like. U.S. Pat. No. 3,520,987 suggests increasing the capacitance of this type of laminated bus bar by attaching to each of a pair or overlapping, current carrying conductors, a plurality of electrically conductive layers of foil, which are laminated in the bar in interleaved, overlapping relation. In practice it has also been customary to attach separate bulk capacitors to the exterior of a laminated bus bar, and electrically to connect each capacitor across certain conductors in the bar. Alternatively these bulk capacitors may be laminated into one end of the bar, but this usually results in an undesirable increase in the thickness of the bar in the area of a capacitor.

One of the advantages of utilizing laminated bus bars of the type described is that the bars exhibit at least a certain amount of flexibility. Early efforts to laminate ceramic capacitors right into the bar proved to be unsatisfactory, because of the thickness and brittleness of the then-available capacitors, and the consequent distortion of the profile of the bus bar. As an alternative, efforts have been made to incorporate a dielectric ceramic material, such as barium titanate in powder form, directly into the dielectric and the resin which is used for laminating together the various conductors in the bar. This did not prove to be satisfactory because the barium titanate powder tended to disperse throughout the dielectric and resin, and as a consequence sufficient quantites of the ceramic material did not come into direct contact with the metal surfaces of the conductors. More recently, however, technology in the area of thin layered ceramic capacitors has reached a level in which it has been possible to produce extremely thin layers or wafers of ceramic dielectric materials which exhibit sufficient flexibility to enable incorporation thereof directly into a laminated bus bar.

U.S. Pat. No. 3,778,735, for example, teaches the desirability of incorporating a plurality of such wafers, each with a metalized coating on each side thereof, between the surfaces of a pair of metal conductor strips, which are encapsulated in an insulating sheath. While transmission lines or bus bars of the type disclosed in this particular patent allegedly are suitable for use in supplying power for integrated circuits, these bars nevertheless lack the flexibility and the desired high capacitance which are achievable as a result of applicants' invention as set forth hereinafter.

One object of this invention is to provide an improved laminated bus bar which exhibits substantially high electrical capacitance and mechanical flexibility as compared to prior such bars.

Another object of this invention is to provide an improved bus bar of the type described in which extremely thin, wafer-like inserts of ceramic material are incorporated in its insulation to increase its capacitance, and which inserts are installed in the bar in such manner that they function to maintain the capacitance of the bar regardless of any fracture of the inserts which may take place after incorporation into the bar.

Another object of this invention is to provide for use in a bus bar of the type described a novel dielectric element which can be used both to insulate bus bar conductors as well as to increase the capacitance thereof.

Still another object of this invention is to provide a novel method for incorporating into bus bars of the type described, insulation with thin, wafer-like inserts of dielectric ceramic materials incorporated therein, thereby considerably to increase the capacitance of the resultant bar.

Other objects of the invention will be apparent hereinafter from the specification and from the recital of the appended claims, particularly when read in conjunction with the accompanying drawings.

Figure 1:
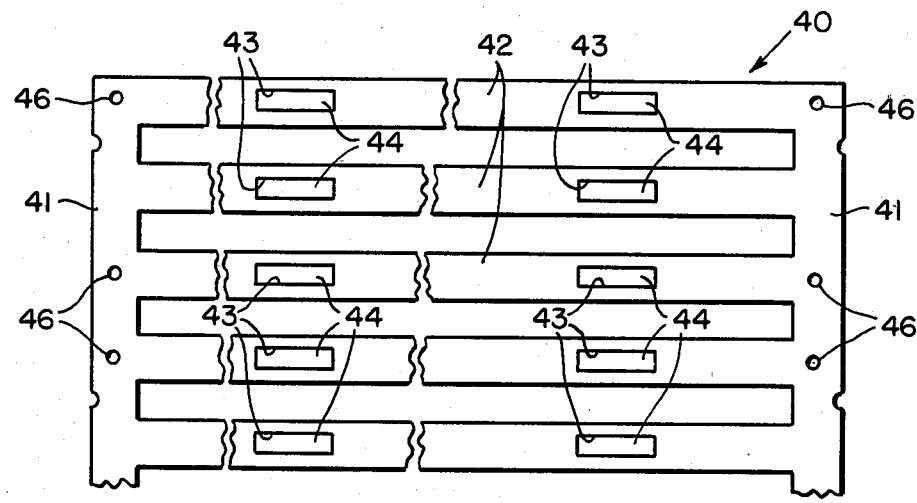
FIG. 1 is a fragmentary plan view of a special layer of insulation which is adapted to be incorporated into laminated bus bars of the type made according to this invention.

Referring now to the drawings by numerals of reference, 40 denotes generally an insulator blank or laminate which is generally similar in configuration to the like-designated laminate illustrated in U.S. Pat. No. 3,886,654, which patent is owned by the assignee of the instant application. It comprises a pair of spaced side webs 41, which are interconnected by parallel, transversely extending insulator strips 42, each of which is adapted to be incorporated into a bus bar as noted hereinafter. Each of the insulator strips 42, which in the embodiment illustrated is about 7 mils thick, has therein a plurality of spaced, longitudinally extending, rectangular openings 43. Secured in each opening 43 in a manner noted hereinafter is a thin wafer-like, dielectric ceramic insert made from, for example, a barium titanate composition sold by Minnesota Mining & Manufacturing Co. under the trademark "Al Si Mag 1283".

Each insert 44 in the embodiment illustrated has a thickness in the range of 7 to 10 mils, and preferably is at least as thick, or thicker, than the strip 42 of insulation in which it is housed. Although not illustrated in the drawings, it is to be understood that the opposed plane surfaces of each insert 44 are metalized, or coated with an extremely thin layer of metal, for example by vapor deposition or the like.

Each blank 40 may be prepared by cutting or punching it from a thin layer of flexible, plastic insulating material, such as for example the type sold by E. I. DuPont deNemours & Co., Inc. under the trade name "NOMEX", and which material has been previously coated with a partially cured resin. This punching operation not only forms the rectangular openings 43 in the blanks, but also the circular openings 46 which are utilized later during assembly operations. In the embodiment illustrated each opening 43 is approximately $\frac{3}{4}''$ in length, and has a width approximately equal to half the width of a respective strip 42.

After the cutting or punching operation, each blank 40 is sent to a sub-assembly point where the dielectric inserts or wafers 44 are placed in the openings 43. The inserts fit snugly in the openings 43, but not so snugly that they will remain in the openings without further treatment. Therefore, in order to secure the wafers 44 in the openings 43 at least so that the blanks can thereafter be manipulated during assembly of the bus bars without causing the wafers to drop from the openings, each blank 40 with the inserts 44 assembled therein is subjected to a relatively low temperature treatment, for example by placement in a heating unit maintained at a temperature in the range of 150° F. to 250° F. This treatment causes some of the still uncured coating on each blank 40 to melt and flow to engagement with the marginal edges of the wafers or inserts 44, thus securing the inserts in the associated blank 40. Each partially cured sub-assembly 40 with its inserts 44 can now be manipulated by an operator for assembly in the final bus bars as noted hereinafter.

It is important to note that the low temperature heat treatment (150° F. to 250° F.) of the sub-assembly 40 with inserts 44 does not result in the complete curing of the resin coating on the blank 40. It merely permits a portion of the resin to flow into contact with inserts 44. Obviously when the sub-assemblies are withdrawn from the low temperature ambient the resin cools and secures the inserts 44 in the associated blank.

Figure 2:
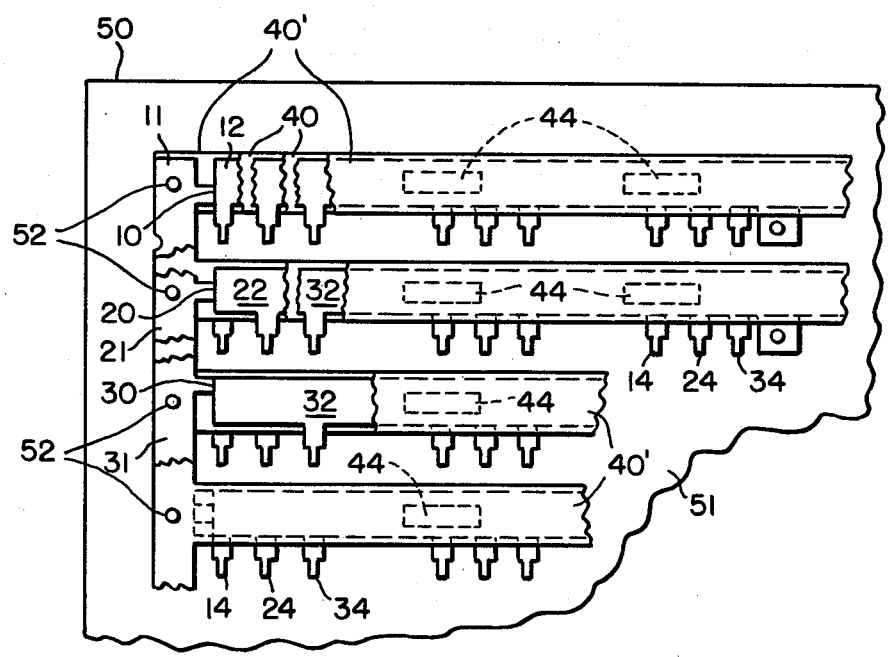
FIG. 2 is a fragmentary plan view of an assembly fixture and illustrating the manner in which special laminating layers of the type shown in FIG. 1 are adapted to be incorporated into bus bars made according to this invention.

In order to assembly the blanks 40 with the attached inserts 44 into bus bars, the procedures as set forth in the above-noted U.S. Pat. No. 3,886,654, may be followed. For example, using the assembly fixture 50 (FIG. 2) and a plurality of metal blanks 10, 20 and 30, which are similar to U.S. Pat. No. 3,886,654, an initial layer 40' of insulation, which is similar in configuration to the blank 40 except that it does not have therein any of the openings 43 or inserts 44, is located by means of its openings 46 over the mounting pins 52 on the fixture 50. Thereafter the webs 11 of the blank 10 are mounted over the pins 52 to position this metal blank on the lower-most insulating blank 40', after which one of the sub-assemblies 40, containing the inserts 44, is mounted over the blank 10 in such manner that its inserts 44 will register with the midportions of the parallel conductor strips 12 which extend between the webs 11 of blank 10. Thereafter, as will be apparent from an examination of FIG. 2 herein, the blank 20 is assembled on top of the first insulating blank 40, then is covered with a second blank 40, after which the metal blank 30 is positioned on the assembly, and thereafter is covered with the final, outer insulating layer 40' which is similar to the bottom or initial insulating layer 40'.

After the above assembly steps have been completed, the assembly is partially laminated as noted in the U.S. Pat. No. 3,886,654, the side webs or looms of the insulating and conducting blanks are removed, and the final lamination steps takes place to complete the lamination of each bar. This final lamination step also completes the curing of the resin coatings on the insulating layers 40, 40'.

Figure 3:
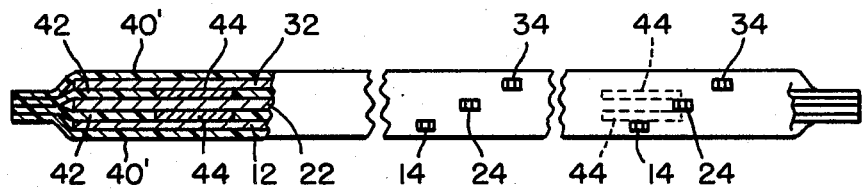
FIG. 3 is a fragmentary side elevational view of a bus bar after it has been assembled and laminated in accordance with one embodiment of this invention, a portion of the bar being broken away and shwon in section.

Referring now to FIG. 3, which illustrates fragmentarily and partially in section a laminated bus bar made in accordance with the above-described process, it will be noted that in each such bar the opposed metalized surfaces of the inserts 44 are in direct contact with the adjacent confronting surfaces of the metal strips 12, 22 and 32 at longitudinally spaced points therealong. When the middle conductor 22, for example, is used as the grounded conductor, extremely high capacitance exists between it and the adjacent conductors 12, 32, as compared to prior bus bars of this type. Morever, even in those instances when a bar of this type has been flexed to a point which would cause fracture of one or more of the ceramic inserts 44 contained in the bar, it has been found that the characteristically high capacitance of the bar is not substantially altered.

Figure 4:
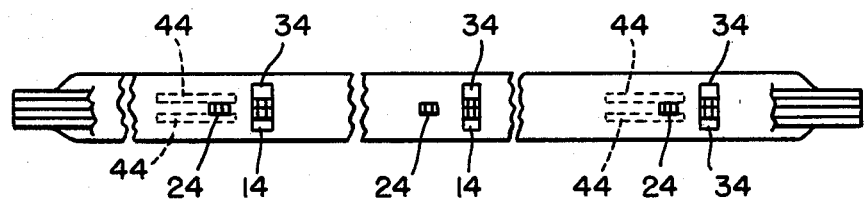
FIG. 4 is a view similar to FIG. 3 but showing a modified form of this bus bar.

In the embodiment shown in FIG. 3, it will be noted that the various tabs or terminals 14, 24, and 34 of the respective strip conductors 12, 22 and 32 have been purposely offset from each other longitudinally of the bar to prevent any undesirable shorting of one upon the other. It has been found, however, that if the tabs 14, 34 of, for example, the strips 12 and 32, are deliberately placed in longitudinal registry with each other, and the registering tabs 14 and 34 are then deliberately connected to each other as shown in FIG. 4, the capacitance of the resulting bar, as between strip 22, and the now interconnected strips 12 and 32, is increased even further as compared to the bar shown in FIG. 3.

Figure 5:
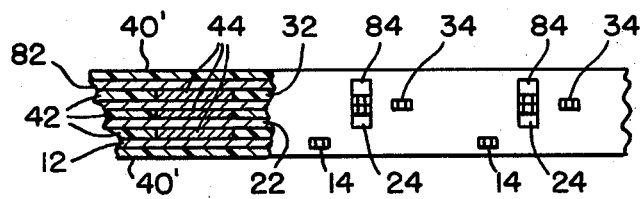
FIG. 5 is a fragmentary sectional view similar to FIG. 4, but showing only a portion of still another form of this bus bar.

Still another type of bar is shown in FIG. 5, wherein like numerals are employed to denote elements similar to those shown in the preceding embodiments. In this bar a fourth metal conductor strip 82 has been added and is separated from strip 32 by a strip 42 of insulation which contains a plurality of the inserts 44, the opposed, metalized surfaces of which are in contact with the confronting surfaces of the conductor strips 82 and 32, respectively. Also in this embodiment strip 82 has the usual, spaced tabs 84 projecting from at least one edge thereof, and which in this embodiment register with, and are connected to, the tabs 24 of conductor strip 22. This manner of interconnecting strips 24 and 84, which are arranged in alternating relationship with strips 12 and 32, also increased significantly the capacitance as between the respective conductors 12 and 32 relative to the interconnected strips 22 and 82 when the latter function, for example, as the ground strips.

From the foregoing, it will be apparent that the present invention provides a relatively simple and inexpensive process for producing extremely high capacitance laminated bus bars. The distributed capacitance which is incorporated in applicants' novel bus bars by use of the wafer-thin inserts 44 in the insulation enables the production of extremely compact bus bars, and obviates the need to employ the bulk capacitance in the form of conventional capacitors attached externally to the conductors of the laminated bar. By selection of the quantity and disposition of the ceramic inserts 44 in the bus bar, and more particularly in the insulation proper, it is possible to design a respective bar to have a predetermined capacitance. Moreover, since the inserts are mounted within, and protected by, the surrounding laminations of the bar, they will be protected from moisture and mechanical strains which might otherwise alter their characteristics. Furthermore, this capacitance can be readily altered during the manufacture of the bars merely by placing in registry, and connecting, the projecting side tabs 14, 24, 34, etc. of the various conductor strips in a bar, thereby substantially to increase its capacitance when necessary or desirable.

It should also be noted that high capacitance insulation sub-assemblies of the type denoted at 40, or at least the strips 42 thereof which contain the ceramic dielectric inserts 44, could be regarded as constituting capacitor elements which are incorporated in the bus bar. For example, one of the former ways of increasing the capacitance of a printed circuit, or the like, was physically to connect one or more bulk capacitors to the circuit, with one lead of a capacitor connected to the ground terminal of the circuit and the other to the voltage terminal. If, on the other hand, a bus bar of the type disclosed herein were to be utilized for such a circuit, the need for adding bulk capacitors would be eliminated because of the extremely high distributed capacitance contained in applicants' laminated bar. In this sense, therefore, applicants' subassembly 40 or 42 literally functions as a capacitor when utilized in the manner disclosed herein. Referring to FIG. 3, for example, when the metal conductor strip 22 functions as the ground conductor, the adjacent insulator strips 42 containing the inserts 44 filter out any electronic noise which might otherwise be developed during current flow in the adjacent conductors 12 and 32.

While certain dimensions of the sub-assembly 40 and associated inserts 44 have been suggested herein, it will be apparent that these dimensions are cited merely by way of example, and that they could be changed without departing from this invention. Likewise, the configuration of the inserts 44 could be altered, as could be the number and configurations of the conductor strips employed in the illustrated embodiments. The embodiment shown in FIG. 5, for example, could be manufactured with the tabs 14 registering with, and connected to, the tabs 34 of conductor 32, whereby alternate conductors 12 and 32 would be interconnected and interleaved with the intervening metal strips 22 and 82, which are interconnected by their respective tabs 24 and 84. Thus, depending upon the number of conductor strips in a bar, there are several different ways in which the metal strips can be connected to provide the desired capacitance.

Moreover, while only certain embodiments have been illustrated and described in detail herein, it will be apparent that they are capable of still further modification, and that this application is intended to cover any such modifications that may fall within the scope of one skilled in the art or the appended claims.

In connection with the illustrations of the bus bars in FIGS. 3 to 5, it will be appreciated that the relative sizes of the components have been exaggerated merely for purposes of illustration.

Having thus described our invention, what we claim is:

1. A laminated bus bar comprising
   a pair of flat, metal, strip conductors, each having a plurality of circuit-connecting projections extending from at least one edge thereof,
   a first layer of dielectric insulation laminated between and electrically insulating said conductors one from the other,
   additional layers of dielectric insulation laminated over and enclosing the outside surfaces of said conductors except in the areas of said circuit-connecting projections,
   a ceramic insert incorporated in said first layer of insulation and operative significantly to increase the capacitance of said conductors,
   at least three of said conductor strips being laminated together within said additional layers of insulation, and with one of said first layers of insulation being laminated between each pair of adjacent conductors,
   each of said first layers of insulation having therein a plurality of longitudinally spaced openings and each of said openings having one of said inserts secured therein with opposite sides of said insert engaged with the confronting surfaces of the two conductors which flank the respective first layer of insulation, and
   means connecting at least certain of the projections on one of a first pair of said conductors with certain of the projections on the other of said first pair of conductors thereby further to increase the capacitance as between said first pair of conductors and a third conductor in said bar.

2. A laminated bus bar as defined in claim 1, wherein there are four conductors laminated in said additional layers of insulation and separated from each other by said first layers of insulation, and said first pair of conductors are disposed in alternating relation to the remaining conductors in said bar.

3. A strip of dielectric insulation for use in making laminated electrical bus bars, condensers, and the like comprising
   a thin, flexible, dielectric layer of plastic having at least one opening therein, and having thereon a partially cured resin coating,
   a thin, ceramic insert which is similar in configuration to, and slightly smaller than, said opening, and
   means securing said insert in said opening and in substantially coplanar registry with said layer of plastic,
   said means comprising a portion of said resin coating which has been caused to flow into fixing engagement with marginal edge portions only of said insert.

4. A strip of dielectric insulation as defined in claim 3, wherein said insert is a thin, wafer-like layer of a barium titanate composition, and opposed surfaces of which wafer-like layer have been metalized.

5. A strip of dielectric insulation as defined in claim 4, wherein said insert has a thickness slightly greater than that of said layer of plastic so that said insert projects slightly from said opening.

6. A method of manufacturing a high capacitance laminated bus bar, comprising
   preparing from a resin-coated layer of plastic, dielectric material a thin, flexible strip of insulation having at least one opening therein,
   securing a thin, wafer-like dielectric ceramic insert in said opening, placing said strip between two metal strip conductors to insulate said conductors from each other, and laminating said conductors in a plastic insulating jacket, and with opposite sides of said insert secured against the confronting surfaces of said conductors, said insert being secured in said opening by partially curing said strip before its assembly with said conductors, thereby to cause part of said coating to flow into fixing relation relative to said insert to secure the latter in said opening in generally coplanar relation to said strip.

7. A method as defined in claim 6, including preparing from said dielectric material a blank comprising a plurality of said strips extending in spaced, parallel relation to each other, and transversely between two, spaced side portions of said blank, each of said strips having therein a plurality of like openings spaced from each other longitudinally of the strip, placing one of said inserts in each of said openings in said strips and partially curing said blank to secure the inserts therein, placing said partially cured blank between and in registry with two metal blanks having configurations similar to said partially secured blank, laminating the assembled blanks between two, outer insulating jackets which also have configurations similar to said partially cured blank, and thereafter separating said laminated strips by removing the registering side portions of said blanks and jackets.

* * * * *